United States Patent

Chien et al.

Patent Number: 6,110,843
Date of Patent: Aug. 29, 2000

[54] ETCH BACK METHOD FOR SMOOTHING MICROBUBBLE-GENERATED DEFECTS IN SPIN-ON-GLASS INTERLAYER DIELECTRIC

[75] Inventors: Wen-Cheng Chien, Kaohsiung; Chen-Peng Fan, Hsin Chu, both of Taiwan

[73] Assignee: Taiwan Semiconductor Manufacturing Co., Hsin-Chu, Taiwan

[21] Appl. No.: 09/246,296

[22] Filed: Feb. 8, 1999

[51] Int. Cl.[7] .......................... H01L 21/31; H01L 21/469
[52] U.S. Cl. .......................... 438/782; 438/723; 438/743
[58] Field of Search .................................. 438/782, 723, 438/743

[56] References Cited

U.S. PATENT DOCUMENTS

| | | | |
|---|---|---|---|
| 4,676,867 | 6/1987 | Elkins et al. | 156/643 |
| 4,775,550 | 10/1988 | Chu et al. | 427/38 |
| 5,223,443 | 6/1993 | Chinn et al. | 437/8 |
| 5,429,912 | 7/1995 | Neoh | 430/325 |
| 5,434,096 | 7/1995 | Chu et al. | 437/44 |
| 5,554,567 | 9/1996 | Wang | 437/195 |
| 5,834,346 | 11/1998 | Sun et al. | 438/231 |

*Primary Examiner*—Tuan H. Nguyen
*Assistant Examiner*—Erik D. Kielin
*Attorney, Agent, or Firm*—George O. Saile; Stephen B. Ackerman

[57] ABSTRACT

The present invention relates to the fabrication of semiconductor devices and more particularly to a new method for avoiding abnormal via holes when Spin On Glass, SOG, is used as a means of planarizing an interlevel metal interconnect structure. The invention addresses the problem of locations of micro bubbles in a SOG layer that can lead to seams, voids and a ragged surface topology which, in turn, can make it very difficult to eventually etch well formed via holes at such locations. The invention details a new etch back method that solves the above problem by properly smoothing the micro bubble locations. This new method includes a sequence of anisotropic and isotropic etching steps that are used to partially etch back the cured SOG layer in order to achieve a planarized surface while also smoothing the micro bubble locations in the cured SOG layer. By having first smoothed out the micro bubble locations, it is then possible to deposit an overlying conventional CVD oxide layer without creating highly detrimental seams and voids above the original micro bubble locations. By greatly minimizing such seams and voids, and their associated tendency for uncontrollable etching behavior, proper etching of via holes is now achievable above the original micro bubble locations and the above problem of abnormal via holes is solved.

20 Claims, 3 Drawing Sheets

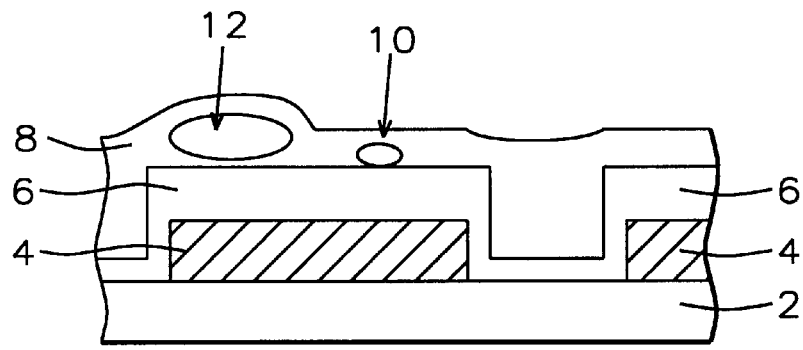
*FIG. 1A - Prior Art*
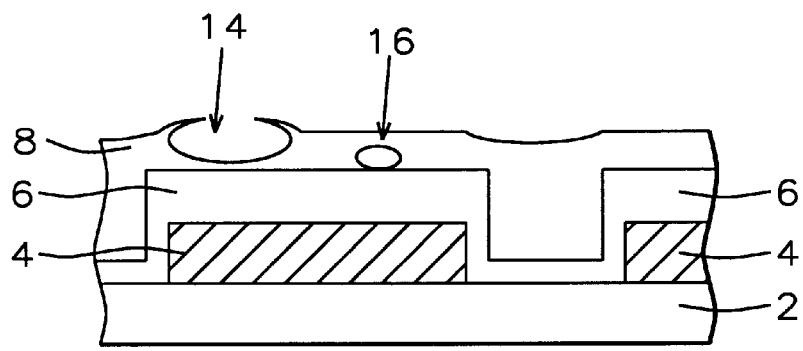
*FIG. 1B - Prior Art*
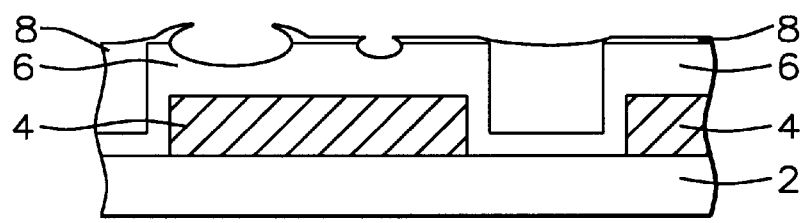
*FIG. 1C - Prior Art*

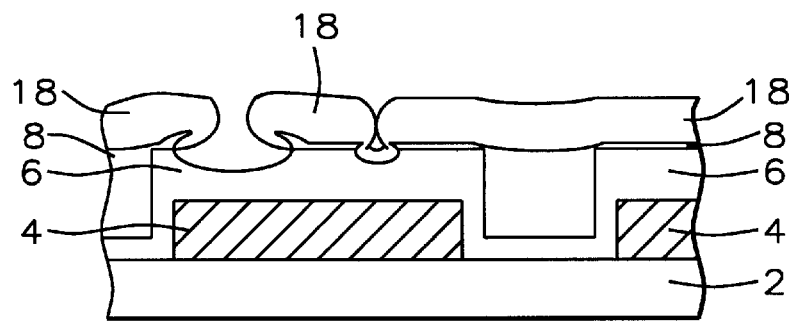
FIG. 1D – Prior Art
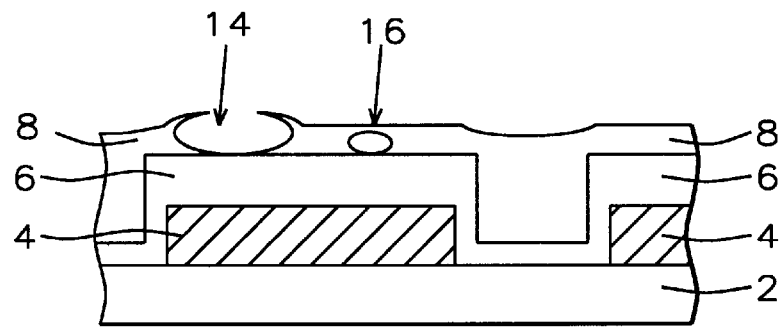
FIG. 2A
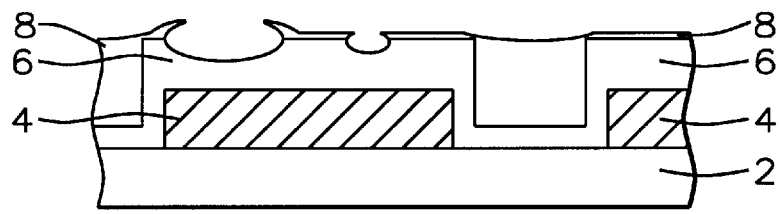
FIG. 2B

ETCH BACK METHOD FOR SMOOTHING MICROBUBBLE-GENERATED DEFECTS IN SPIN-ON-GLASS INTERLAYER DIELECTRIC

FIELD OF THE INVENTION

This invention relates to the fabrication of integrated circuit devices and more particularly to a method for avoiding abnormal via holes that can result from micro bubbles in layers of spin on glass, SOG.

BACKGROUND OF THE INVENTION AND PRIOR ART

In order to meet higher and higher chip performance (speed) and density objectives, for the submicron era, increasing attention has been placed on multilevel-interconnect technology. The benefits of further reductions in device dimensions will not be fully realized unless the performance and density limitations of interconnects are also continually improved. Accordingly, the line spacing between metal interconnect lines has been continually deceased while the number of Multilevel Interconnect, MLI, layers have been continually increased. Unfortunately, this very necessary evolution in MLI development has not been easy. For example, there are yield and reliability issues that numerous investigators have attributed to a worsening degree of surface planarity (smoothness) that is aggravated by smaller line spacing and more MLI layers.

MLI structures are usually formed by stacking a number of patterned metal interconnect layers that are electrically isolated from one another by interlevel dielectric layers. The vertical step heights associated with each patterned metal layer create a rugged surface of spaced lines that is subsequently covered by a somewhat conformal dielectric layer, such as CVD or plasma TEOS. Due to the conformal nature of such dielectric processes, the surface of each dielectric layer tends to replicate the rugged topology of the underlying pattered metal layer. Consequently, each succeeding patterned metal layer needs to somehow be formed on a dielectric surface whose topology is increasingly more rugged than that of the previous underlying dielectric layer. This poses a limit on the number of patterned metal layers that one can stack before serious yield and reliability problems are encountered.

Yield problems can be encountered when the degree of planarity is not sufficient for the depth-of-field limitations associated with optical lithography exposure tools. For example, the resolution of sub-micron optical lithography will be degraded if the localized step heights on a chip surface are greater than 0.5 microns.

Reliability problems can be encountered when insufficient surface planarity leads to the formation of undesirable gaps, seams and voids in the interlevel dielectric layers. These problems can more readily occur when closely spaced metal lines are covered by a conformal insulating layer. For example, in the case of submicron line spacing, the adjacent side walls of the conformal insulating layer will be so much closer together than the side walls of the underlying metal lines that they can tend to almost touch or actually touch. Such close proximity of adjacent insulator side walls can lead to the formation of narrow gaps, seams and voids along their line of intersection. In turn, these gaps, seams and voids can become locations of chemical entrapment and eventual reliability problems.

Efforts to overcome some of the above problems associated with insufficient surface planarity have dealt with the need to improve the planarity of the metal layers and as well as that of the interlevel insulator layers. To date, more effort has been put into improving the planarity of the insulator layers. This has, for example, included: (1) Thermal flow of insulators (such as boron doped CVD oxides) for smoothing undesirably steep steps, (2) Growth of thicker than required insulator layers (thicker layers tend to be smoother), followed by an etch back process and (3) numerous ways of exploiting Spin On Glass, SOG, as a self planarizing insulator layer.

Spin On Glass, SOG, has many desirable attributes. It can be applied in a liquid state (spun on similar to photoresist), whereby it will automatically tend to fill all undesirable gaps and globally planarize an entire wafer as it naturally seeks its own level.

SOG materials are organic siloxanes or silicates mixed in alcohol-based solvents. After being spun on, a series of relatively low temperature (in the range of 150–400 C) baking and curing steps are used to drive off the solvent and then to convert the SOG to an inorganic silicon dioxide layer.

There have been numerous variations on the usage of SOG in the semiconductor industry, as a means of improving planarization during the formation of multilevel interconnect layers. In many cases SOG has been a useful means of achieving a planar surface. However, SOG also has its own problems. For example, poor adhesion to conventional CVD layers can lead to delamination problems and air bubbles can eventually lead to poorly formed via holes.

Regarding SOG, there is prior art which addresses the problems from both poor adhesion and air bubbles. For the case of undesired air bubbles, solutions have been published for minimizing their initial creation. However air bubbles in SOG do not seem to be completely preventable and once created they can be a serious problem, particularly in the vicinity of eventual via holes. Consequently, a solution is needed for minimizing the detrimental effects of some degree of unavoidable air bubbles in cured SOG layers. The present invention addresses that need.

U.S. Pat. No. 4,676,867, to Elkins, et. al., teaches a method of planarization, whereby a SOG layer is first applied over the surface of a conventional non-planar insulating layer (such as a doped CVD oxide) to provide a planarized surface. The cured SOG layer is then sacrificially etched back to partially expose the underlying insulator. This is purposely done to minimize SOG related problems, associated with adhesion and the etching of vias in SOG. Finally, an additional insulating layer (such as doped CVD oxide) is deposited which preserves planarity while increasing the overall thickness of the composite insulating layer to the desired value. However, during the SOG etch back step, the detrimental effects of the localized absence of SOG (due to air bubbles originally in the SOG layer, for example) could still present a problem.

U.S. Pat. No. 4,775,550, to Chu, et. al, teaches a method of planarization, similar to that of Elkins, et. al, above. Also similar to Elkins, et. al., the detrimental effects of the localized absence of SOG (due to air bubbles originally in the SOG layer) during the etch back step could still present a problem.

U.S. Pat. No. 5,554,567, to Wang, teaches a method to minimize the adhesion problems associated with SOG. The moisture level in the SOG is kept low by baking the SOG in a vacuum and then maintaining a vacuum while the SOG layer is then passivated by an overlying oxide layer (such as CVD oxide). This method is featured as a means of allowing a SOG layer to remain on a surface without having to perform the somewhat complicated etch back step in the above patents. However, it does not address the problems that could occur during the etching of via holes in SOG, as a result of air bubbles originally in the SOG layer.

U.S. Pat. No. 5,429,912, to Neoh, teaches a method that might, conceivably, be used to minimize air bubbles in SOG layers. Bubble free liquid is drawn from the bottom of a well during the spin on process of liquids, such as photoresist or developer. However, it does not specifically address SOG or how to minimize the detrimental effects of air bubbles, in SOG layers, after they have been created.

SUMMARY OF THE INVENTION

A principle object of the present invention is to provide an effective and manufacturable method of avoiding abnormal via holes over a semiconductor substrate.

Another object of the present invention is to provide an improved method for using Spin On Glass, SOG, as a means of planarizing the surface of a semiconductor substrate while minimizing the detrimental effects of micro bubbles, in the SOG layer, during eventual via hole formation.

A further object of the invention is to provide a method for minimizing the ragged topology that can be created after a cured SOG layer, originally containing some undesirable micro bubbles, has been etched back as part of a process to improve the surface planarity of a semiconductor substrate.

A still further object of the invention is to provide a method to solve the problem of abnormal via holes, comprising the steps of: (a) depositing a patterned metal layer over a semiconductor substrate; (b) depositing a first dielectric layer over said patterned metal layer; (c) applying a layer of Spin On Glass, SOG, to achieve global planarization of the surface of the aforementioned structure; (d) perform an anisotropic etch back process to open up small gaps and voids originating from micro bubbles in the SOG layer, (e) performing wet or dry isotropic etching to smooth out the ragged topology originating from micro bubbles in the SOG layer and (e) depositing a second dielectric layer over the surface of the said smoothed SOG layer that will then be acceptable for normal via hole formation.

The invention provides a method for solving the problem of abnormal via holes that can be created by micro bubbles in SOG layers, where SOG is being used for planarizing mulilevel interconnect layers. Micro bubbles in SOG layers can lead to unacceptable surface planarity, insulator seams and insulator voids. For purposes of illustrating this point, FIGS. 1A to 1D show how micro bubbles in a SOG layer can lead to such unacceptable conditions for proper via hole formation.

Referring now more particularly to FIG. 1A, there is shown a metal line 4, that is part of a patterned metal interconnect layer. Overlying metal line 4 is a conformal insulator layer 6. The aforementioned structure is covered by a self planarizing layer of SOG 8 that happens to contain two micro bubbles 10 and 12, immediately above metal line 4. These micro bubbles will pose a serious problem for the proper formation of an eventual via hole down to metal line 4, as will now be discussed. During the curing of SOG layer 8, the micro bubbles will tend to out gas and the result could be the situation that is illustrated in FIG. 1B. Micro bubble 12 has now burst and become micro bubble artifact 14. Micro bubble 10 has enlarged slightly and is now micro bubble artifact 16.

Referring now to FIG. 1C, there is shown the result of having used a partial anisotropic plasma etch back process, as an attempt to make defects like micro bubble artifact 14 less ragged as well as to further planarize the surface of SOG layer 8.

Referring now to FIG. 1D, there is shown the result of having deposited a subsequent CVD oxide layer, 18 prior to the formation of a via hole down to metal line 4. Note that there are now highly unacceptable conditions for being able to form a normal via hole down to metal line 4. Uncontrolled lateral and vertical etching could occur, due to seams and a void. In addition, the lack of planarity could impact the control of the photo lithography image for the eventual via hole.

When such undesirable artifacts occur at the location of an eventual via hole, this will very likely result in the abnormal formation of that via hole. The present invention solves this problem of abnormal via hole formation by means of a sequence of etch back steps that are designed to transform the aforementioned undesirable micro bubble induced artifacts into a physical state that is once again compatible with the requirements for subsequent well formed via holes.

BRIEF DESCRIPTION OF THE DRAWINGS

In the accompanying drawings for a material part of this description, there is shown:

FIGS. 1A through 1D schematically illustrate in cross-sectional representation the problem that is solved by the present invention.

FIGS. 2A through 2E schematically illustrate in cross-sectional representation a preferred embodiment of the process of the present invention.

DESCRIPTION OF THE PREFERRED EMBODIMENTS

Figure 2C:
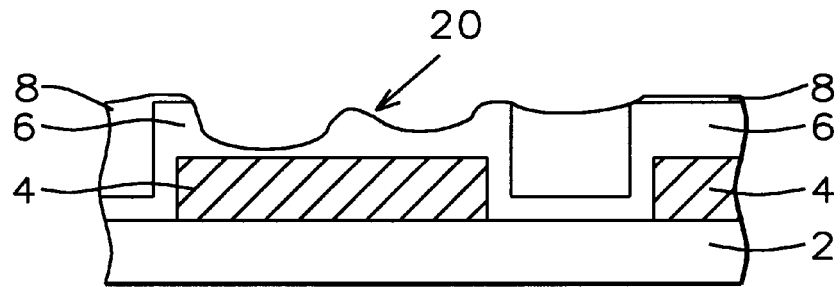

Referring now more particularly to FIG. 2A, there is shown a portion of a partially completed integrated circuit. There is shown a semiconductor substrate 2 intended to represent a number of common situations such as the surface of some semiconductor, conductor or insulator. A patterned metal line 4, as part of a patterned metal interconnect layer, is shown on the surface of semiconductor substrate 2. A first insulating layer 6 covers metal line 4. A self planarizing layer of Spin On Glass, SOG, 8 covers insulating layer 6. Also shown are the undesirable artifacts from an earlier presence of micro bubbles, at locations 14 and 16, in the SOG layer 8. Micro bubble region 16 is shown as a void contained within SOG layer 8 and micro bubble region 14 is shown as having burst (due to out-gassing during curing, for example) through the surface of SOG layer 8. Minimizing eventual abnormal via hole formation, as a result of such undesirable micro bubble artifacts, is the main object of the present invention.

The present invention is quite compatible with a variety of materials and associated processes for forming metal line 4 and overlying insulating layer 6, as is somewhat generally illustrated in FIG. 2A. Continuing to refer to FIG. 2A, the patterned metal layer (of which metal line 4 is a part) could be formed from a number of electrically conductive materials (such as Aluminum, Al, or Copper, Cu) and by a number of deposition methods (such as CVD or sputtering). One example of a process for forming the patterned metal layer, that has worked well, is: (1) metal deposition, by means of sputtering and (2) metal etching, by means of plasma dry etching.

The width of metal line 4 could be about 0.5 microns, or greater, and the thickness of said line could be in the range from about 4000 to 6000 angstroms. The line spacing for the patterned metal layer, of which metal line 4 is a part, could be about 0.5 microns.

Insulating layer 6 could be formed from a number of processes such as plasma enhanced CVD (PECVD), where $SiH_4$ and $N_2O$ is used for the deposition chemistry, at a temperature of about 400° C. for about 10 minutes. The preferred thickness range of said layer 6 is about 1500 to 2500 angstroms. Said insulating layer 6 could be continuous and conformal to the aforementioned metal layer, as is the illustrated case for FIG. 2A, or it could be designed to just wrap around each metal line.

SOG layer 8 could also be formed in a variety of ways and still be compatible with the present invention. One example of a process for forming SOG layer 8, is by means of using SOG type 111, which can be purchased from TOK. For this case, a SOG layer thickness of about 3400 angstroms is processed through the following sequence of curing steps: 250° C. for 20 mins, 380° C. for 20 mins and 470° C. for 20 mins.

Referring now more particularly to FIG. 2B there is shown the result of the first of two steps, in the present invention, that are used to minimize the potential detrimental effects of micro bubble artifacts 14 and 16.

The first step in the present invention is to partially etch back the cured SOG layer. The reader will please note that since the SOG cure cycle has now converted the SOG layer from an organic material to an inorganic silicon dioxide layer, it will henceforth be referred as a silicon dioxide layer instead of a SOG layer.

An anisotropic plasma etch process is used is used for general planarization of the said silicon dioxide surface, as well as to open up the small hole and void that constitute micro bubble artifacts 14 and 16. This partial etch back process is used to facilitate the ability of a subsequent isotropic etch step that will be used to smooth the ragged edges of micro bubble artifact 14 as well as to eliminate what would otherwise be a troublesome void, micro bubble artifact 16. For said anisotropic etch back process approximately 1500 angstroms of said silicon dioxide surface is removed after a predetermined etching time. This has been accomplished by means of sputter etching, using a Lam 4500 Etcher, as follows: gas=Ar only, RF power=600 W, time=30 seconds, temperature=40° C.

Referring now more particularly to FIG. 2C, there is shown how the ragged edges of micro bubble artifacts 14 and 16 have been considerably smoothed out by either a wet or a dry (sputter) isotropic etching process. The result is a much smoother surface 20, which is highly desirable for eventual proper via hole formation. For said isotropic etch back process, approximately 300 angstroms of the silicon dioxide surface is removed after a predetermined etching time. This can be accomplished with a dry isotropic etch step (using an $O_2$ plasma) or a wet isotropic etch step (using diluted HF, in conjunction with agitation for circulating the etch solution). Said wet isotropic etching step is typically performed in about 15 seconds, at 25° C., in order to remove a thickness of silicon dioxide between about 250 and 350 angstroms.

Figure 2D:
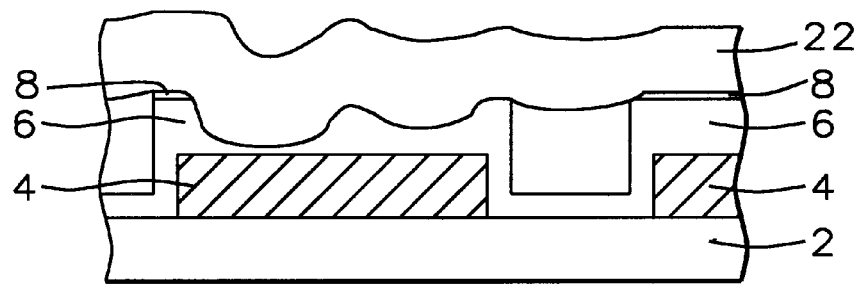

Referring now more particularly to FIG. 2D, there is shown how a subsequent oxide insulating layer 22 has been used to increase the overall insulator thickness, over metal line 4, in preparation for via hole formation and, perhaps, a subsequent patterned metal layer, which is not shown.

The objects of the invention have now been accomplished. Micro bubble artifact regions 14 and 16 have been transformed into a physical state that is now far more compatible with the requirements for avoiding an abnormally formed via hole, down to metal line 4.

Figure 2E:
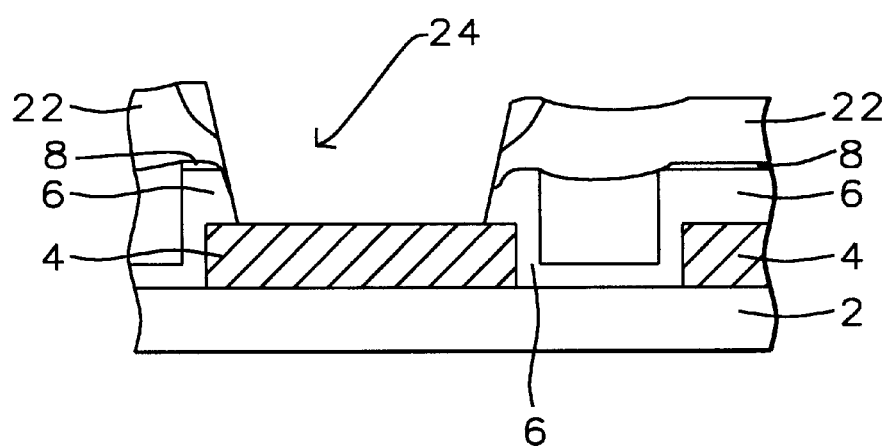

Referring now more particularly to FIG. 2E, there is shown a normal via hole 24 that has been formed down to metal 4, by means of a conventional wet etching followed by dry etching process. As shown is FIG. 2E, via hole 24 is well formed. This is a direct, beneficial result of having used the present invention to avoid seams and voids in silicon dioxide layer 8 (formally SOG layer 8) and overlying insulator layer 22. Such seams and voids (originating from the micro bubbles in the initial SOG layer) would have, otherwise, caused localized uncontrolled etching to occur during the etching of via hole 24.

While the invention has been particularly shown and described with reference to the preferred embodiments thereof, it will be understood by those skilled in the art that various changes in form and details may be made without departing from the spirit and scope of the invention.

What is claimed is:

1. A method for removing voids from a silicon dioxide layer, formed by a spin on process, comprising:
    a) depositing a Spin On Glass, SOG, layer over a first insulating layer and then curing said SOG layer to form a silicon dioxide layer; wherein bubbles which were formed during said depositing result in voids in said silicon dioxide layer;
    b) partially etching back said silicon dioxide with an anisotropic plasma etch process;
    c) further partially etching back said silicon dioxide with a isotropic process (wet etching or dry sputter etching); and
    d) depositing a second insulating layer over the resultant said silicon dioxide layer.

2. The method of claim 1 wherein the thickness of said silicon dioxide (SOG layer) is between about 3200 to 3600 angstroms (on a blank wafer).

3. The method of claim 2 wherein the oxide thickness loss of said silicon dioxide layer after partially etching back is between about 1500+/−200 angstroms.

4. The method of claim 2 wherein the oxide thickness loss of said silicon dioxide layer, after said further partially etching back, is about 300+/−50 angstroms.

5. The method of claim 1, wherein said isotropic etching is performed with a wet process, such as a dilute HF solution.

6. The method of claim 1, wherein said isotropic etching and sputter etching are performed with a dry plasma process, such as $O_2$ plasma and Ar plasma.

7. The method of claim 1, wherein said anisotropic etching is performed by means of plasma dry etching.

8. A method to solve the problem of abnormal via holes, comprising the steps of:
    a) depositing a patterned metal interconnect layer over a semiconductor substrate;
    b) depositing a first insulating layer over said patterned metal layer;
    c) depositing a Spin On Glass, SOG, layer over said first insulating layer and then curing said SOG layer to form a silicon dioxide layer wherein bubbles which were formed during said depositing result in voids in said silicon oxide layer;
    d) partially etching back said silicon dioxide with an anisotropic plasma etch process;
    e) Further partially etching back said silicon oxide with either a wet or a dry (sputter etching) isotropic process;
    f) depositing a second insulating layer over said resultant silicon oxide layer; and
    g) forming via holes through said second insulating layer and said silicon dioxide layer down to said patterned metal layer.

9. The method of claim 8, wherein said metal interconnect layer is composed of materials selected from the group consisting of Al and Cu.

10. The method of claim 8, wherein said metal interconnect layer is deposited by sputtering and consists of patterned lines with a thickness of between about 4000 and 6000 angstroms and having lines widths of about 0.5 microns or greater.

11. The method of claim 8, wherein said first insulating layer is deposited by PECVD to a thickness of between about 1500 and 2500 angstroms.

12. The method of claim 8, wherein said Spin On Glass, SOG, prior to curing, is deposited by a SOG Coater to a thickness of between about 3200 and 3600 angstroms.

13. The method of claim 8, wherein the curing process for said silicon dioxide layer is a furnace process.

14. The method of claim 8, wherein the partial anisotropic etch back process Is plasma dry etching.

15. The method of claim 8, wherein said wet partial isotropic etch back process is by means of a dilute HF solution.

16. The method of claim 8, wherein said dry partial isotropic etch back process and sputter etching is $O_2$ plasma or Ar plasma.

17. The method of claim 8, wherein said second insulating layer is deposited by PECVD to a thickness of between 5000 and 6000 angstroms.

18. The method of claim 8 wherein the thickness of said silicon dioxide is between about 6500 and 8000 angstroms.

19. The method of claim 2 wherein the thickness loss of said silicon dioxide after partially etching back is about 1500+/−200 angstroms.

20. The method of claim 2 wherein the thickness loss of said silicon dioxide after said further partially etching back is about 300+/−150 angstroms.

* * * * *